United States Patent [19]

Hshieh et al.

[11] Patent Number: 5,486,772
[45] Date of Patent: Jan. 23, 1996

[54] RELIABILITY TEST METHOD FOR SEMICONDUCTOR TRENCH DEVICES

[75] Inventors: Fwu-Iuan Hshieh, Saratoga; Calvin K. Choi, San Jose; William H. Cook, Fremont; Lih-Ying Ching; Mike F. Chang, both of Cupertino, all of Calif.

[73] Assignee: Siliconix incorporation, Santa Clara, Calif.

[21] Appl. No.: 268,755

[22] Filed: Jun. 30, 1994

[51] Int. Cl.$^6$ .................................................. G01R 31/26
[52] U.S. Cl. .......................... 324/769; 324/754; 324/765; 324/768
[58] Field of Search .................................. 324/769, 754, 324/765, 768, 719; 364/488

[56] References Cited

U.S. PATENT DOCUMENTS

| | | | |
|---|---|---|---|
| 826,875 | 9/1978 | Feldman | 324/765 |
| 4,520,448 | 5/1985 | Tremintin | 364/488 |
| 4,542,340 | 9/1985 | Chkravarti et al. | 324/769 |
| 4,835,458 | 5/1989 | Kim | 324/754 |
| 5,239,270 | 8/1993 | Desbiens | 324/719 |

*Primary Examiner*—Kenneth A. Wieder
*Assistant Examiner*—Kourosh Cyrus Khosravi

*Attorney, Agent, or Firm*—Skjerven, Morrill, MacPherson, Franklin & Friel; Brian D. Ogonowsky; William L. Paradice, III

[57] ABSTRACT

The present invention detects defects near the gate/trench-surface interface of trench transistors. Defects near this interface which cause long term reliability problems generally also result in charges being trapped near the interface. In accordance with one embodiment of the present invention, a negative voltage is applied to the gate of the trench transistor with its drain grounded and its source floating. A leakage current flowing between the gate and drain is measured as a function of the voltage applied to the gate. A transistor whose gate-drain leakage current exceeds a predetermined value at a specified gate voltage is deemed to be defective. In another embodiment of the present invention, the gate-drain leakage current is measured as described above and monitored over time. Charge accumulated near the gate-drain interface due to defects in the interface results in the gate-drain leakage current taking a longer period of time to fall off to its steady state value. Accordingly, if the leakage current of a particular trench transistor does not fall off to a predetermined value within a predetermined amount of time, the transistor is deemed to be defective. The minimum/maximum allowable gate-drain leakage current published in a data sheet for the trench transistor will provide consumers with additional assurance of the transistor's long term reliability.

10 Claims, 3 Drawing Sheets

5,486,772

RELIABILITY TEST METHOD FOR SEMICONDUCTOR TRENCH DEVICES

FIELD OF THE INVENTION

This invention relates to testing semiconductor devices for reliability. More particularly, this invention relates to testing trench MOS transistors before burn-in to determine their quality and reliability.

BACKGROUND OF THE INVENTION

The market for semiconductor transistors is becoming increasingly competitive as more manufacturers are introducing a wider variety of semiconductor transistors. As a result, consumers have more products from which to choose and, accordingly, must make more decisions as to what transistor to purchase from which manufacturer. Perhaps one of the most important factors influencing consumers' purchasing decisions is the reliability of a transistor over its expected life. Recognizing the significance that a transistor's reliability may have in the marketplace, manufacturers employ various tests to ensure that each of their respective transistors will continue to meet its original specifications even after prolonged use. Manufacturers usually publish these specifications in a transistor's data sheets and guarantee that each transistor meets its published specifications and will continue to do so even after prolonged use.

One well known method of testing the reliability of a particular transistor is to measure the transistor's specifications immediately after fabrication and then, after subjecting the transistor to a burn-in process, again measure the transistor's specifications to determine if the specifications measured after burn-in are consistent with the original specifications. In performing such a test, manufacturers typically measure various combinations, or even all, of the following specifications for a given transistor: (1) the forward bias voltage for the source-drain junction ($V_{SD}$), (2) the leakage current between gate and source ($I_{GSS}$), (3) the threshold voltage ($V_{TH}$), (4) the leakage current between drain and source ($I_{DSX}$), (5) the transistor's on-resistance ($R_{DS}$), and (6) the transistor's breakdown voltage ($V_{BV}$). These specifications may be measured using, for example, a FETTEST series 3600 or series 9400 menu-driven die tester.

After the original specifications are measured, the transistor is placed into a furnace and heated to approximately 150 degrees Celsius or higher for 160 to 170 hours. This time-consuming burn-in process simulates the aging process of the transistor. The burned-in transistor is then removed from the furnace and its specifications are measured again as described above. A transistor which still meets its original specifications after being subjected to the burn-in process passes the test and is accordingly deemed to be reliable. Thus, the burn-in process is used to determine whether a transistor may have long-term reliability problems.

The burn-in test may be conducted on every transistor or just on a sampling of the transistors. Trench transistors have become prominent in power applications due to their high voltage and high current characteristics. The trench transistor utilizes a vertical structure wherein a polysilicon gate is formed in a trench etched in the transistor's substrate as described in U.S. Pat. No. 5,072,266 issued to Bulucea et al, incorporated herein by reference. FIGS. 1A and 1B show the formation of such a prior art trench transistor 10. Trench transistor 10 has N+ layer 12 which acts as a drain, N− layer 13 overlying drain 12, P+ layer 14 overlying layer 13, and N layer 16 overlying layer 14. Layer 16 serves as a source for transistor 10, while layer 14 acts as a body. Layer 13 acts as a drift region for transistor 10. Trench 18 is etched in transistor 10 so as to intersect drift region 13, body layer 14, and source 16, as shown in FIG. 1A.

Those surfaces of layers 13, 14, 16 created during the etching of trench 18 will be collectively denoted as trench-surface 19, as shown in FIG. 1B. A layer of oxide 20 is then formed on trench-surface 19 of transistor 10. Polysilicon gate 22 is deposited in trench 18 such that gate 22 is insulated from drift region 13, body layer 14, and source 16 by oxide 20. The structure of trench transistor 10 results in a more efficient utilization of semiconductor surface area, thereby saving space and cost.

The unique structure of the trench transistor, however, leads to problems for testing the transistor's long term reliability. Referring again to FIG. 1B, many defects may arise during the etching of trench 18 which affect the quality of the surfaces of layers 13, 14, 16 created during the etching of trench 18. These defects may include, for example, non-uniform surface conditions of trench-surface 19 and oxide 20, stress-induced defects between gate 22 and oxide 20 and between oxide 20 and trench-surface 19, defects within drift region 13, dangling bonds, and impurities present near the oxide 20/trench-surface 19 interface. These defects, being somewhat unique to trench transistors, may not be effectively detected by the conventional functional or parametric electric test which, as described above, was developed for testing planar and other non-trench transistors.

Accordingly, there is a need for a better, more accurate method for detecting defects in trench transistors. There is also a need for a such a method which is not as time consuming as the burn-in process discussed above.

SUMMARY OF THE INVENTION

The present invention is effective in detecting defects near the gate/trench-surface interface of trench transistors. Defects present near this interface which cause long term reliability problems generally also result in charge accumulating near this interface. In accordance with one embodiment of the present invention, these defects are detected as follows. With the drain tied to ground potential and the source left floating, a negative voltage is applied to the gate. A leakage current flowing between the gate and drain is measured as a function of the voltage applied to the gate. A transistor whose gate-drain leakage current exceeds a predetermined value at a specified gate voltage (or as the gate voltage is increased) will be deemed to have failed the test and will be discarded prior to any burn-in test.

In another embodiment of the present invention, the gate-drain leakage current is measured as described above as a function of time. Charge accumulated near the gate-drain interface due to defects in the interface results in the gate-drain leakage current taking a longer period of time to fall off to its steady state value. Accordingly, if the leakage current of a particular trench transistor does not fall off to a predetermined value within a predetermined amount of time, the transistor is deemed to have failed the test and will be discarded prior to any burn-in test.

The maximum allowable gate-drain leakage current published in a data sheet for a trench transistor will provide the consumer with additional assurance that the transistor will provide long term reliability.

Conventional tests, previously described, are conducted in conjunction with the novel gate-drain leakage current test.

DETAILED DESCRIPTION OF THE PREFERRED EMBODIMENTS

The invention provides an improved method for testing the quality and long term reliability of a trench transistor. This method may be used in conjunction with the prior art test previously described above.

Figure 1A:
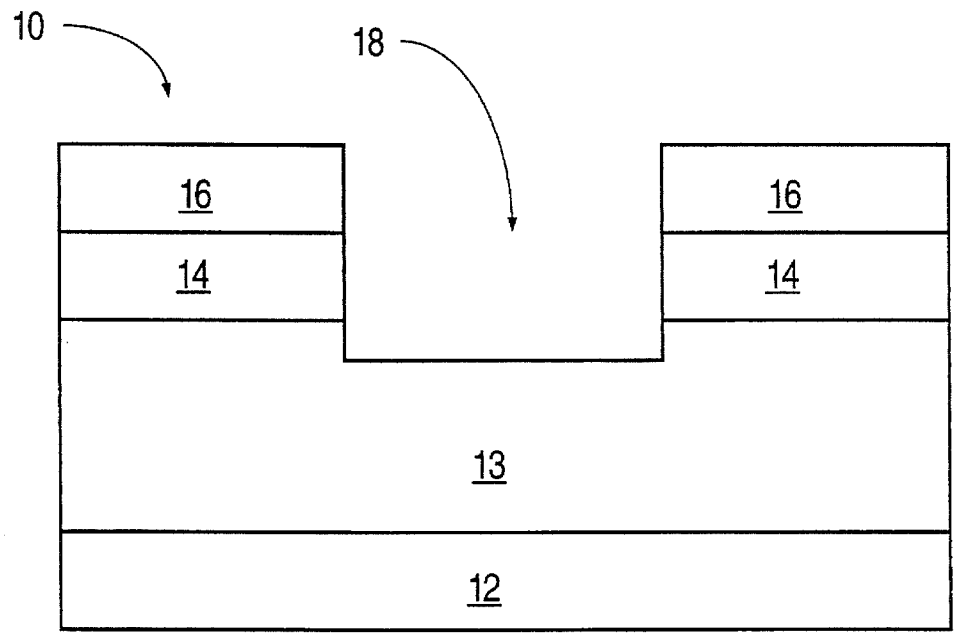
FIGS. 1A and 1B show cross-sectional views of a prior art trench transistor.
Figure 1B:
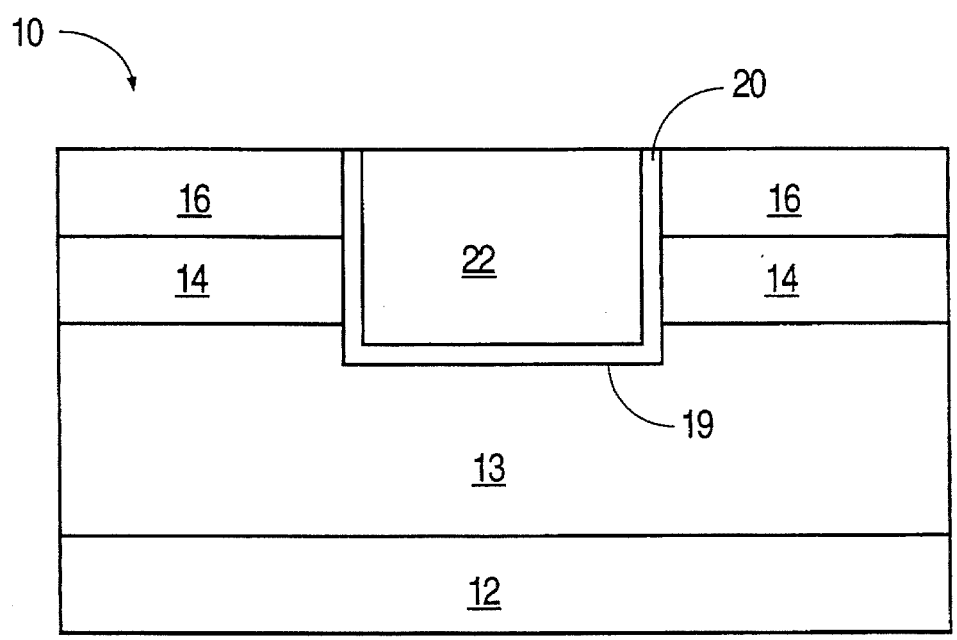

As mentioned earlier (and referring to FIGS. 1A and 1B), forming trench 18 in layers 13, 14, 16 often leads to defects in the gate oxide 20/trench-surface 19 interface as well as stress between gate 22 and trench-surface 19. Such defects may include, for instance, residual etchant damage to oxide 20 and/or layers 13, 14, 16, surface roughness of oxide 20 and/or layers 13, 14, 16, and ionic metallic contamination. Further, ionizing radiation typically used in dry etching processes may result in the trapping of holes at the oxide 20/trench-surface 19 interface. These trapped holes, in turn, cause the generation and trapping of excess positive charge at the oxide 20/trench-surface 19 interface. These defects, stress, and trapped holes (if not annealed out) will lead to an undesirably high leakage current flowing between gate 22 and drain 12, thereby resulting in an unreliable transistor, i.e., one that will to fail to meet its device specifications after prolonged use.

In accordance with one embodiment of the present invention, the magnitude of the gate-drain leakage current flowing between a transistor's gate and drain is measured and used in determining the transistor's reliability.

Figure 2:
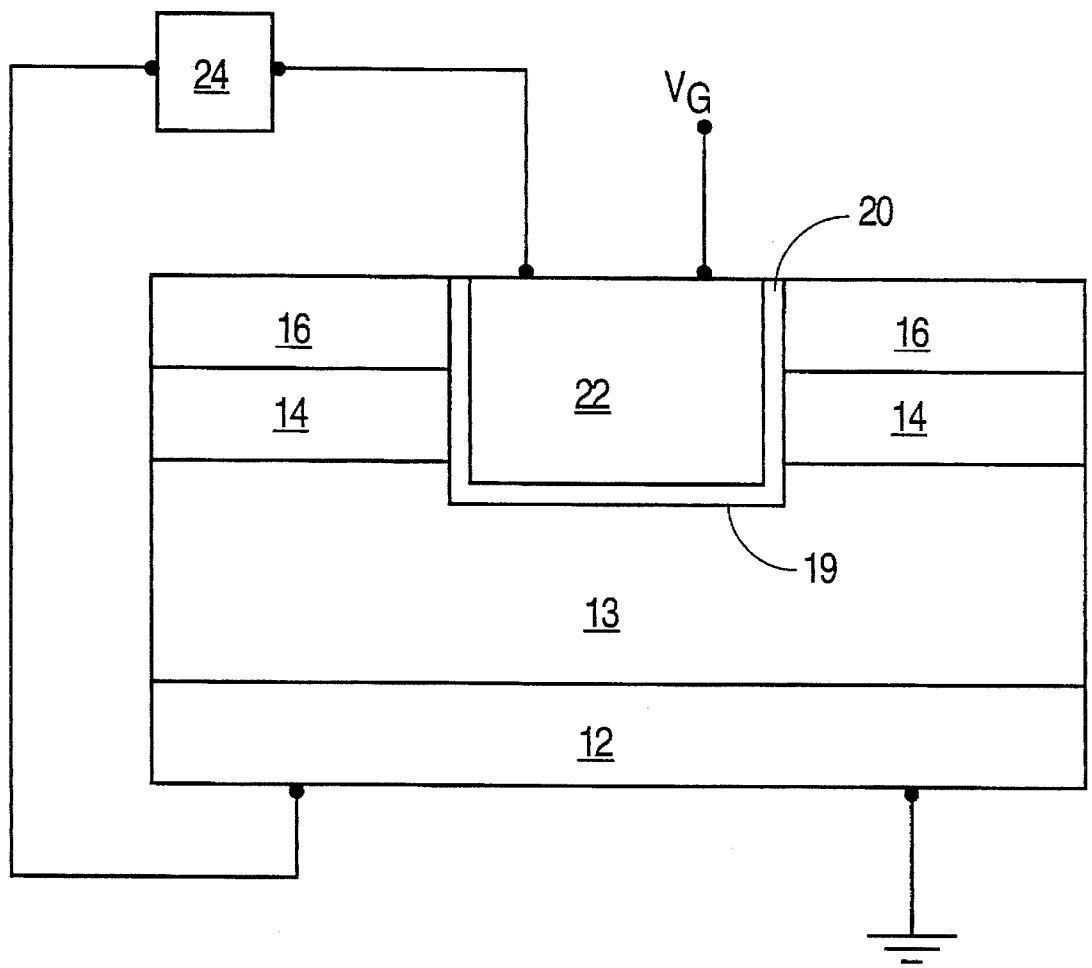
FIG. 2 shows a portion of the transistor of FIG. 1 illustrating the transistor undergoing the novel test method in accordance with one embodiment of the present invention.
Figure 3:
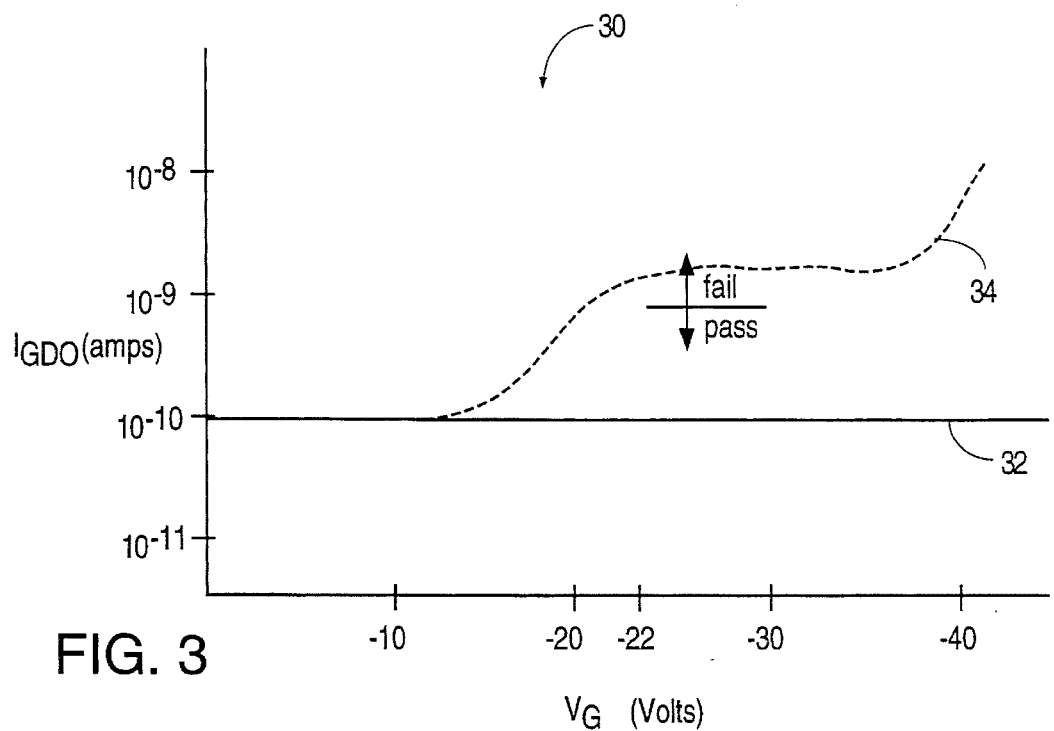
FIG. 3 is a graph of the gate-drain leakage current vs. gate voltage of a good transistor (solid line) and a bad transistor (dashed line) during testing in accordance with one embodiment of the present invention.

Referring to FIG. 2, a negative voltage is applied to gate 22, drain 12 is coupled to ground, and source 16 is left floating. A conventional circuit die tester 26, such as the FETTEST series 3600 tester, is connected to transistor 10 and programmed to measure the gate-drain leakage current, hereinafter denoted as $I_{GDO}$. It has been found in certain trench transistors that a negative voltage applied to gate 22 will incur an $I_{GDO}$ on the order of approximately 0.1 nano-amps. FIG. 3 shows graph 30 plotting $I_{GDO}$ versus the voltage $V_G$ applied to gate 22 for a certain type of trench transistor. Solid line 32 shows the $I_{GDO}$ versus $V_G$ relationship of a good quality trench transistor having insubstantial defects caused during the manufacture of the trench transistor. Dashed line 34 shows the $I_{GDO}$ versus $V_G$ relationship of a poor quality trench transistor having defects in drift region 13 or oxide 20/trench-surface 19 interface which threaten the long term reliability of the transistor. It has been experimentally determined for a certain trench transistor that if, upon increasing the voltage applied to gate 22 in excess of negative 22 volts, the gate-drain leakage current exceeds approximately 1.0 nano-amps (see line 34 of FIG. 3), the defects present in transistor 10 are considered to threaten the long term quality and reliability of transistor 10. Accordingly, if a particular transistor exhibits this $I_{GDO}$ versus $V_G$ relationship, the die is discarded prior to being subjected to any burn-in process. If, on the other hand, $I_{GDO}$ remains below approximately 1.0 nano-amps for gate 22 voltages exceeding approximately −22 volts, the transistor is considered to be reliable and the die is readied for packaging.

Using a value of approximately 1.0 nano-amps as the threshold value for $I_{GDO}$ for the method described above, it has been found that fifty (50) percent of the trench transistors which fail the method described above fail a subsequent burn-in process test, i.e., fifty percent of those transistors which fail the above test will, after burn-in, no longer meet their original specifications. The above described method is thus effective in detecting defective trench transistors prior to burn-in testing and also effective in identifying defective transistors which might not be identified in a burn-in test. It follows, then, that a transistor which meets the above $I_{GDO}$ specification will be of a higher quality than a transistor which has not been subjected to such a test.

Figure 4:
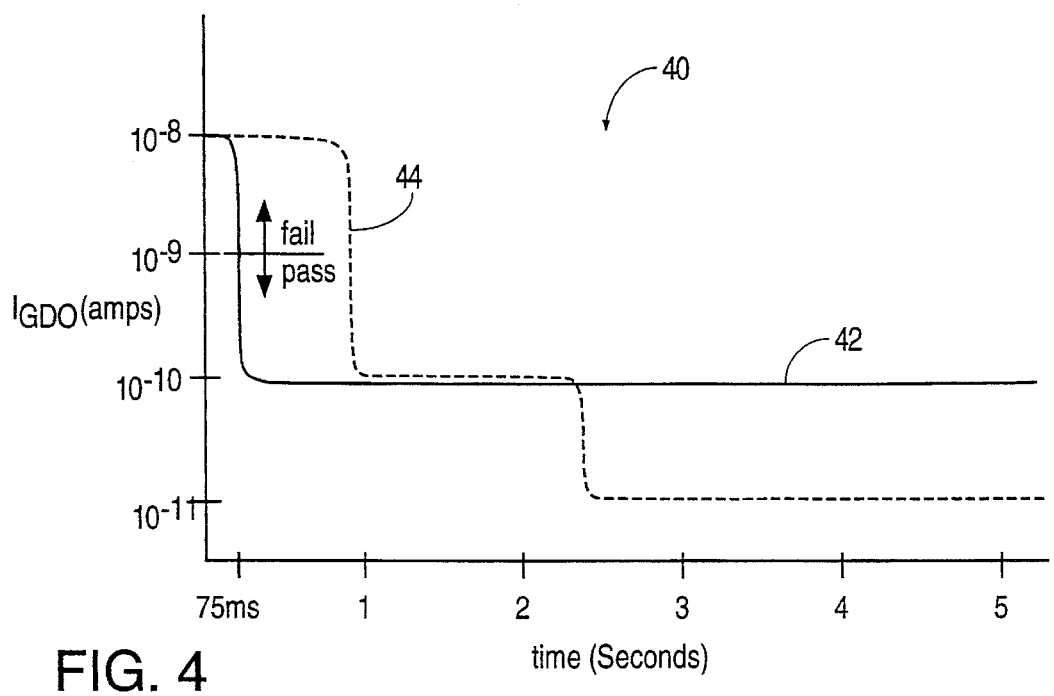
FIG. 4 is a graph of the gate-drain leakage current vs. time of a good transistor (solid line) and a bad transistor (dashed line) during testing in accordance with another embodiment of the present invention.

In another embodiment of the present invention, a voltage of negative 22 volts is applied to gate 22 with drain 12 grounded and source 16 floating. $I_{GDO}$ is measured using, for example, a FETTEST series 3600 tester 26 and may be plotted versus time, as illustrated in FIG. 4. Solid line 42 shows the relationship between $I_{GDO}$ and time for a trench transistor being substantially free from any defects in the trench structure. It can be seen from FIG. 4 that for such a reliable transistor, $I_{GDO}$ should drop below 1.0 nano-amps within approximately 100 ms after voltage is applied to gate 22. A large portion of the 100 ms delay is caused by delays due to the tester and the tester leads. Thus, the tolerable delay should take into account these delays associated with the tester. Those transistors which exhibit such an $I_{GDO}$ versus time relationship as depicted by solid line 42 are considered to be reliable.

Conversely, dashed line 44 shows the $I_{GDO}$ versus time relationship of a trench transistor having reliability problems caused by defects related to the trench structure. As mentioned earlier, a defective trench structure results in excess holes and, thus, excess positive charge, accumulating at the oxide 20/trench-surface 19 interface. Due to these excess charges trapped at the oxide 20/trench-surface 19 interface, $I_{GDO}$ requires a longer time to fall off to its steady state value of approximately 0.1 nano-amps. Thus, an $I_{GDO}$ versus time relationship depicted for example by dashed line 44, where $I_{GDO}$ does not drop below approximately 1.0 nano-amps within 100 ms, indicates that the transistor's trench structure is defective. The die containing these transistors are accordingly discarded without any need for a burn-in test.

The above method shown in FIG. 4 for testing the reliability of a trench transistor results in an effective screening process for detecting defective transistors. In Applicants' experiments, fifty percent of the transistors that fail the above described test fail a burn-in test. Thus, both of the embodiments discussed above may be used in lieu of, or to avoid, an inconvenient and time consuming burn-in test, thereby saving time and money. Both embodiments of the present invention may be performed in a few minutes rather than 160+ hours.

The threshold value of $I_{GDO}$, which serves as a pass/fail criteria for screening out defective trench transistors, is proportional to the size of the die to be tested. For example, the threshold value of 1.0 nano-amps for $I_{GDO}$ as used in the description above was experimentally determined for 187 mil by 187 mil die containing 275,000 parallel connected trench transistor cells. Accordingly, when die of a different size containing a different number of cells are tested, the threshold value of $I_{GDO}$ must be adjusted in order to accurately screen those trench transistors having defects which threaten long term reliability.

As mentioned earlier, a transistor's reliability may greatly influence consumer purchasing decisions. Consumers often consult a transistor's data sheets in order to assess a transistor's reliability. Publishing $I_{GDO}$ specifications in a trench transistor's data sheets, and guaranteeing that the transistor will meet its $I_{GDO}$ specification even after prolonged use, will provide consumers with additional assurance of the trench transistor's long term reliability.

The above embodiments were described in reference to an N-channel trench transistor. It is to be understood, however, that the embodiments of the present invention are equally applicable to testing the reliability of p-channel trench transistors, with the polarities discussed above reversed (i.e., where the gate bias is positive relative to the drain).

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A method for testing the reliability of a trench transistor having a source, a gate, and a drain, said method comprising the steps of:

applying a first voltage to said gate;

coupling said drain to a second voltage different from said first voltage;

measuring a leakage current between said gate and said drain;

comparing said leakage current to a threshold current; and identifying said trench transistor as a defective transistor if said leakage current is greater than said threshold current.

2. The method of claim 1 wherein said first voltage is less than zero.

3. The method of claim 1 wherein said first voltage is approximately equal to negative 22 volts.

4. The method of claim 1 wherein said second voltage is zero.

5. The method of claim 1 further comprising the step of coupling said source to a floating potential.

6. The method of claim 1 wherein said step of identifying said trench transistor as a defective transistor comprises:

identifying said trench transistor as a defective transistor if, after a predetermined period of time following the application of said first voltage to said gate, said leakage current is greater than said threshold current.

7. The method of claim 6 wherein said first voltage is less than zero.

8. The method of claim 6 wherein said first voltage is approximately equal to negative 22 volts.

9. The method of claim 6 wherein said second voltage is zero.

10. The method of claim 6 further comprising the step of coupling said source to a floating potential.

* * * * *